United States Patent [19]

Sugino et al.

[11] Patent Number: 5,578,133

[45] Date of Patent: Nov. 26, 1996

[54] DRY CLEANING PROCESS FOR CLEANING A SURFACE

[75] Inventors: Rinji Sugino; Masaki Okuno; Yasuhisa Sato, all of Kawasaki, Japan

[73] Assignee: Fujitsu Limited, Kawasaki, Japan

[21] Appl. No.: 3,384

[22] Filed: Jan. 12, 1993

[30] Foreign Application Priority Data

Jan. 13, 1992 [JP] Japan .................... 4-004162
Jul. 22, 1992 [JP] Japan .................... 4-195041

[51] Int. Cl.$^6$ ................ B08B 5/00; C23F 1/00; C03C 23/00
[52] U.S. Cl. ................ 134/2; 134/3; 156/646.1
[58] Field of Search ................ 134/2, 3; 156/646

[56] References Cited

U.S. PATENT DOCUMENTS 5,030,319  7/1991  Nishino et al. ............... 156/635
5,213,622  5/1993  Bohling et al. ............... 134/3

OTHER PUBLICATIONS

Sugino et al, IEICE Trans, Electron. vol. E75–C, No. 7, Jul., 1992, pp. 829–833.
Sugino et al, Extended Abstract of SSDM '87, Aug. 25–27, 1987, pp. 207–210.
Rinji Sugino et al., "Ultraviolet excited Cl–radical etching of Si through native oxides", Journal of Applied Physics, vol. 76, No. 9, 1 Nov. 1994.

*Primary Examiner*—Zeinab El-Arini
*Attorney, Agent, or Firm*—Armstrong, Westerman, Hattori, McLeland & Naughton

[57] ABSTRACT

A dry cleaning process for removing metal contaminants from a surface of an oxide film includes the steps of: forming a reaction area on the oxide film such that a silicon surface is formed in correspondence to the reaction area, supplying a dry cleaning gas selected from a group essentially consisting of chlorine, bromine, hydrogen chloride, hydrogen bromide and a mixture thereof, to the oxide film including the reaction area, to produce silicon halide molecules as a result of a reaction between the dry cleaning gas and the silicon surface, supplying the silicon halide molecules to a surface of the oxide film, and removing metal elements existing on the surface of the oxide film as a result of a reaction between the metal element and the dry cleaning gas under a presence of the silicon halide molecules.

16 Claims, 11 Drawing Sheets

FIG. 5A
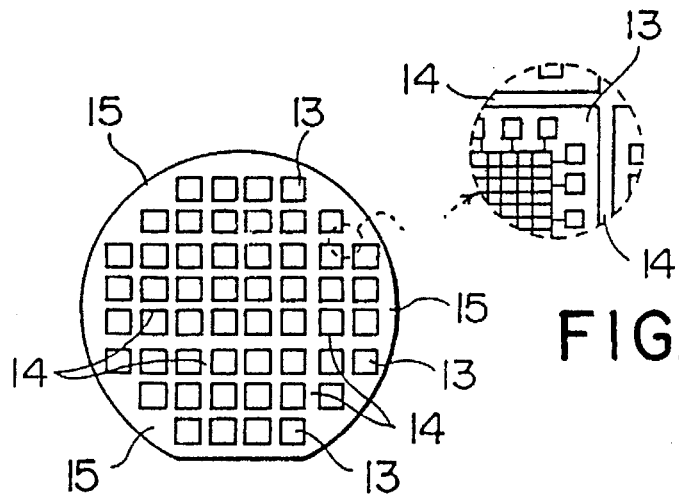
FIG. 5A-1
FIG. 5B
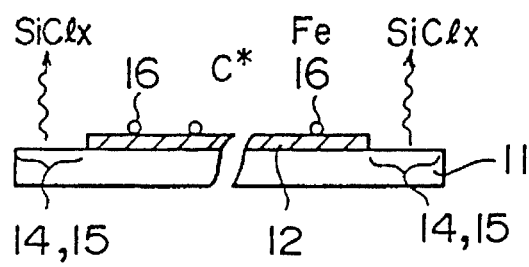
FIG. 5C
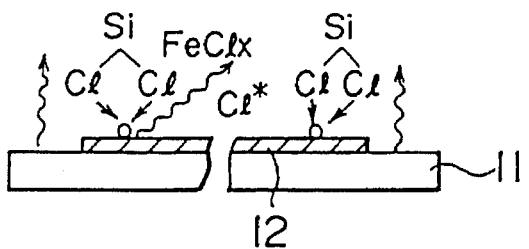
FIG. 5D
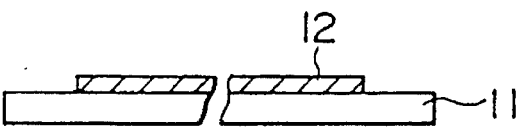

5,578,133

DRY CLEANING PROCESS FOR CLEANING A SURFACE

BACKGROUND OF THE INVENTION

The present invention generally relates to fabrication of semiconductor devices, and more particularly to a dry cleaning process for cleaning semiconductor substrates for removing contaminants that exist on a surface of the semiconductor substrate.

With advancement in the fine lithographic patterning processes for realizing semiconductor devices having increased integration density, the importance of the process for cleaning the surface of semiconductor substrates increases ever and ever.

In order to meet such a stringent demand for the cleanliness of the surface during the fabrication process of semiconductor devices, dry cleaning processes are proposed as an alternative of conventional wet cleaning processes that use various acids or alkalis together with purified water.

In the various deposition processes and patterning processes for forming a semiconductor integrated circuit on a semiconductor substrate, there is a tendency that the surface of the semiconductor structure is contaminated by elements such as iron (Fe) and sodium (Na) that cause various adversary effects in the operation of the fabricated semiconductor device.

FIGS. 1(A) and 1(B) show a conventional dry cleaning process for removing metal contaminants from a semiconductor surface, wherein FIG. 1(A) shows a surface of a semiconductor substrate 61 contaminated by a contaminant 62 such as Fe and Na, and FIG. 1(B) shows the dry cleaning process that occurs on such a contaminated surface. It should be noted that the illustrated process corresponds to a process described in FIG. 9 of Sugino et al, IEICE, Trans. Electron., vol.E75-C, no.7, July, 1992, which is incorporated herein as reference.

In the illustrated conventional process, a halogen gas such as chlorine, hydrogen chloride, fluorine, hydrogen fluoride, and the like, are supplied to the contaminated surface as a dry cleaning gas, while simultaneously maintaining the semiconductor substrate 61 at an elevated temperature for activating the halogen molecules. One may apply ultraviolet radiation as necessary for assisting the activation of the halogen molecules. The halogen molecules thus activated in turn react with the semiconductor substrate 61 to cause a slight etching of the semiconductor substrate 61, and the contaminants 62 are removed simultaneously to the dry etching process thus caused for example in the form of halides such as $FeCl_3$. When applying the foregoing dry cleaning process to the fabrication of semiconductor devices, it is generally necessary to set the cleaning condition such that the amount of etching occurring at the surface of the semiconductor substrate is held to a minimum. This requirement is particularly acute in the fabrication of semiconductor devices having extremely fine patterns.

The foregoing conventional dry cleaning process is effective in the system wherein a substantial etching reaction occurs at the semiconductor surface by the halogen gas as in the case where a chlorine gas is applied to a silicon substrate. In such a case, it is believed that the dry cleaning occurs as a result of the etching of the surface. Thus, there is a demand for a dry cleaning process wherein no substantial etching occurs in the surface that is subjected to the cleaning.

Meanwhile, the foregoing process of applying chlorine gas is inapplicable for cleaning the surface of a stable silicon oxide film that is deposited by sputtering or CVD or formed by a thermal oxidation process, as there occurs no substantial etching reaction between the chlorine gas and the silicon oxide film thus formed.

FIGS. 2(A) and 2(B) are diagrams comparing the effect of conventional dry cleaning process, wherein FIG. 2(A) compares the result of the experiment where Fe is applied intentionally on the exposed silicon surface as contaminant and removed subsequently by the dry etching process, with the result of a similar experiment wherein Fe is applied and removed on and from a silicon oxide surface, instead of the exposed silicon surface. Further, FIG. 2(B) shows the result of similar experiments except that the contaminant element is changed from Fe to Na. In FIGS. 2(A) and 2(B), the hatched bar graph shows the result for the silicon oxide film, while the blank bar graph shows the result for the exposed silicon surface. Further, it will be noted that the arrow A in FIGS. 2(A) and 2(B) indicates the experiment conducted on the silicon oxide film, while the arrow B indicates the experiment conducted on the silicon substrate at a dry cleaning temperature of 200° C. Further, the arrow C in both drawings indicates the experiment conducted on the silicon substrate with a dry cleaning temperature of 400° C.

From FIGS. 2(A) and 2(B), it will be noted that the surface of the silicon substrate is cleaned significantly with the dry cleaning process as indicated in the blank bars, irrespective of whether the contaminant is Fe or Na, while it will be further noted that the surface of the silicon oxide film remains substantially uncleaned as indicated by the hatched bars. It is believed that the foregoing result indicates the strong and stable chemical bond established between the oxygen forming the silicon oxide film and the metal elements such as Fe or Na, and such a strong chemical bond suppresses the etching reaction of the surface.

In order to reduce the bonding energy between oxygen and metal elements and facilitate the etching reaction, the inventors of the present invention proposed previously a dry cleaning process as disclosed in the Japanese Patent Application 2-065105, wherein a silicon chloride ($SiCl_4$) gas is added to the chloride etching gas.

FIG. 3 shows the foregoing dry cleaning process, wherein FIG. 3 shows the process as applied to the structure that includes a silicon substrate 71 covered by a silicon oxide film 72, wherein it will be noted that a contact hole 73 is formed in the silicon oxide film 72.

In the process shown in FIG. 3, $SiCl_4$ is admixed into the chlorine cleaning gas as mentioned before, to facilitate a reaction between the metal contaminant and chlorine radicals. Thereby, metal chlorides such as $FeCl_3$ or $FeCl_x$ are produced in the gaseous form as a result of the reaction between Cl contained in $SiCl_4$ and Fe, wherein the bonding energy between Fe and oxygen in the silicon oxide film is reduced. Thereby, the metal chloride thus formed is removed from the surface of the silicon oxide film 72. There, $SiCl_4$ acts as a catalyst. In order to enhance the foregoing catalytic effect, ultraviolet radiation may be applied to the $SiCl_4$ gas. Thereby, the metal contaminants are effectively removed from the surface of the silicon oxide film.

In the foregoing approach, on the other hand, although the process is effective in reducing the contaminants from the silicon oxide surface, it was observed that a part of the $SiCl_4$ gas, admixed into the chlorine cleaning gas, may reach the contact hole 73 and cause an unwanted deposition of an amorphous silicon film 74 on the exposed surface of the substrate 71.

SUMMARY OF THE INVENTION

Accordingly, it is a general object of the present invention to provide a novel and useful dry cleaning process, wherein the foregoing problems are eliminated.

Another and more specific object of the present invention is to provide an effective dry cleaning process for removing contaminants from a surface of an oxide film that covers a silicon surface, by supplying a halogen gas for dry-cleaning with the surface of said oxide film in the presence of silicon halide molecules on the surface of said silicon oxide film, to cause an effective dry cleaning thereof, while simultaneously suppressing deposition of silicon on an exposed part of the silicon surface.

Another object of the present invention is to provide a dry cleaning process for removing metal contaminants from a surface of an oxide film by creating silicon halide molecules selectively in the vicinity of the oxide film surface as a result of a reaction between a material containing silicon and a halogen gas, and by supplying said halide molecules thus produced to the surface of said oxide film together with said halogen gas for enhancing the dry cleaning effect that is caused by said halogen gas.

Another object of the present invention is to provide a dry cleaning process for removing metal contaminants from a surface of an oxide film by supplying a halide gas of an element selected from the group IIIa elements, the group IVa elements and the group Va elements, in the vicinity of a surface of said substrate.

Another object of the present invention is to provide a dry cleaning process for removing metal contaminants from a surface of an oxide film, said oxide film covering a surface of a substrate for protecting said substrate from a reaction with species that are contained in an environmental atmosphere in which said substrate is held, said method comprising the steps of: forming a reaction area on said silicon oxide film such that a silicon surface is formed on said substrate in correspondence to said reaction area in a state capable of reacting with species that are contained in said environment; supplying a dry cleaning gas selected from a group essentially consisting of chlorine, bromine, hydrogen chloride, hydrogen bromide and a mixture thereof, to said oxide film including said reaction area, to produce silicon halide molecules as a result of a reaction between said dry cleaning gas and said silicon surface; supplying said silicon halide molecules to a surface of said oxide film; and removing metal elements existing on said surface of said oxide film as a result of a reaction between said metal element and said dry cleaning gas under a catalytic action of silicon halide molecules. According to the present invention, the silicon halide molecules that assist the dry cleaning process, are produced selectively in the vicinity of the surface of the silicon oxide film, and the efficiency of the dry cleaning is improved significantly.

Another object of the present invention is to provide a dry cleaning process for removing metal contaminants from a surface of an oxide film, comprising the steps of: providing a material containing silicon in the vicinity of said oxide film, said material being placed in a common environmental atmosphere with said oxide film in a state that silicon contained in said material can react with said environmental atmosphere; supplying a dry cleaning gas selected from a group essentially consisting of chlorine, bromine, hydrogen chloride, hydrogen bromide and a mixture thereof, to said surface of said oxide film and further to said material to produce silicon halide molecules as a result of a reaction between said dry cleaning gas and said material; supplying said silicon halide molecules to a surface of said oxide film; and removing metal elements existing on said surface of said oxide film as a result of a reaction between said metal element and said dry cleaning gas under a catalytic action of said silicon halide molecules. According to the present invention, one can create the silicon halide molecules in the vicinity of the oxide film that is subjected to the dry cleaning process. In this invention, too, the efficiency of utilization of the silicon halide molecules is maximized and an efficient dry cleaning can be achieved.

Another object of the present invention is to provide a dry cleaning process for removing metal contaminants from a surface of an oxide film, comprising a step of: supplying a halide gas containing an element that is selected from the group IIIa elements, group IVa elements and the group Va elements in the form of halide, to said oxide film under a condition set such that no substantial etching of said oxide film occurs, for causing a dry cleaning of said surface of said oxide film.

Another object of the present invention is to provide a dry cleaning process for removing metal contaminants from a surface of an oxide film, comprising a step of: supplying a halogen gas to said surface of said oxide film for causing a dry cleaning thereof; supplying a halide gas containing an element that is selected from the group IIIa elements, group IVa elements and the group Va elements in the form of halide, to said oxide film under a condition set such that no substantial etching of said oxide film occurs, for enhancing said dry cleaning caused by said halogen gas.

Another object of the present invention is to provide a dry cleaning process for removing metal contaminants from a surface of an oxide film, comprising the steps of: providing a material containing an element selected from the group IIIa elements, group IVa elements and the group Va elements in the vicinity of said oxide film; supplying a halogen gas to said oxide film for causing a dry cleaning thereof; supplying said halogen gas to said material to produce halide molecules as a result of reaction between said halogen gas and said element contained in said material; and supplying said halide molecules to said oxide film under a condition set such that no substantial etching of said oxide film occurs, for enhancing said dry cleaning caused by a catalytic action of said halogen gas.

Another object of the present invention is to provide a dry cleaning process for removing metal contaminants from a surface of a silicon substrate, comprising the steps of: forming an oxide film on said surface of said silicon substrate such that said oxide film protects said surface of said silicon substrate from chemical reaction with an environment; removing metal contaminants from a surface of said oxide film by a dry cleaning process, said dry cleaning process comprising the steps of: providing a material containing an element selected from the group IIIa elements, group IVa elements and the group Va elements in the vicinity of said oxide film; supplying a halogen gas to said oxide film for causing a dry cleaning thereof; supplying said halogen gas further to said material to produce halide molecules as a result of reaction between said halogen gas and said element contained in said material; and supplying said halide molecules to said oxide film under a condition that no substantial etching of said oxide film occurs, for enhancing said dry cleaning caused by said halogen gas; and removing said oxide film from said silicon substrate. According to the present invention, one can remove the contaminants from the surface of the silicon substrate with a minimum amount of surface etching.

Other objects and further features of the present invention will become apparent from the following detailed description when read in conjunction with the attached drawings.

BRIEF DESCRIPTION OF THE DRAWINGS

FIGS. 5(A)–5(D) and FIG. 5(A)-1 are diagrams showing the dry cleaning process according to a first embodiment of the present invention;

DETAILED DESCRIPTION OF THE PREFERRED EMBODIMENTS

Hereinafter, preferred embodiments of the present invention will be described.

Figure 4A:
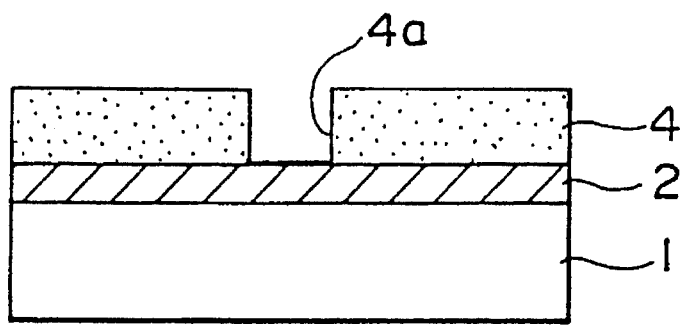
FIGS. 4(A)–4(C) are diagrams showing a typical patterning process together with a semiconductor structure formed as a result of the patterning process and to which the cleaning process of the present invention is applicable.
Figure 4B:
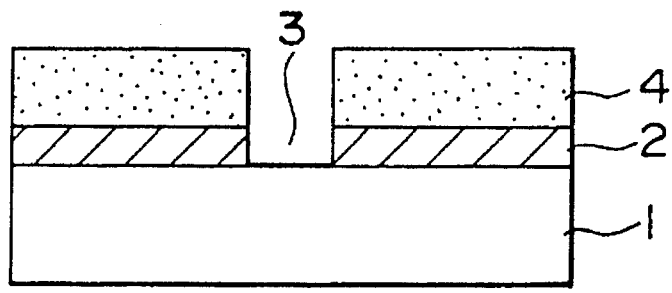
Figure 4C:
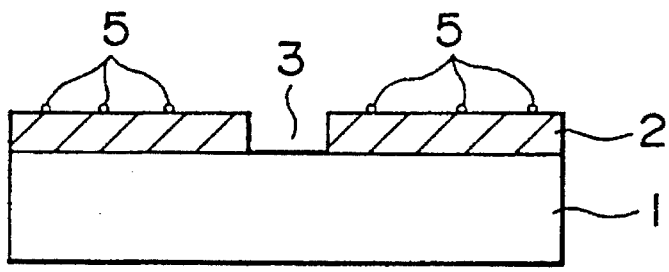

FIGS. 4(A)–4(C) are cross sectional diagrams showing a typical patterning process of a silicon substrate 1 to which the cleaning process of the present invention is applied.

Referring to FIG. 4(A), the substrate 1 is covered by a stable silicon oxide film 2 that may be formed by a thermal oxidation process such that the surface of the substrate 1 is protected from reaction with chemical species contained in the environment. It should be noted that the silicon oxide film 2 may be formed by CVD or sputtering.

On the silicon oxide film 2, a photoresist 4 is applied, wherein the photoresist 4 is patterned photolithographically to form an exposure opening 4a for exposing the surface of the silicon oxide film 2.

Next, in the step of FIG. 4(B), the silicon oxide film 2 is removed in correspondence to the opening 4a while using the patterned photoresist layer 4 as a mask, such that a contact hole 3 is formed for exposing the upper major surface of the substrate 1 in correspondence to the opening 4a. Further, the photoresist 4 is removed by dissolving in a solvent or ashing. Thereby, a structure shown in FIG. 4(C) is obtained.

In the structure of FIG. 4(C) thus formed, it will be noted that contaminants 5, mainly of metal particles such as Fe or Na, are left on the surface of the silicon oxide film 2 after the removal of the photoresist 4. Thus, the principal object of the dry cleaning process of the present invention is to remove these metal contaminants from the oxide surface that covers the surface of a semiconductor layer such as the silicon substrate 1.

FIGS. 5(A)–5(D) and FIG. 5(A)-1 show the dry cleaning process according to a first embodiment of the present invention as applied to a silicon wafer 11 that is covered by a silicon oxide film 12, wherein the silicon oxide film 12 corresponds to the silicon oxide film 2 of the previous drawing and may be formed by a thermal oxidation process, sputtering process or CVD process. On the major surface of the wafer 11, a number of chip regions 13 are formed in rows and columns, wherein the chip region 13 is protected by the silicon oxide film 12 except for the contact holes not illustrated in FIGS. 5(A)–5(D). Further, the chip regions 13 are separated from each other by dicing lines 14 that extend from a marginal region 15 in a criss-cross pattern.

Figure 1A:
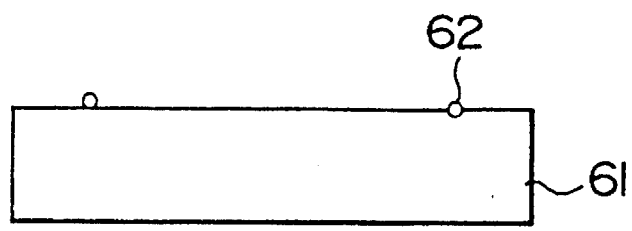
FIGS. 1(A) and 1(B) are diagrams showing a conventional dry cleaning process.
Figure 1B:
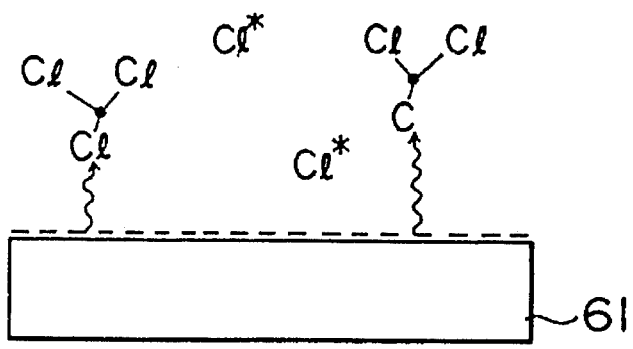

In the step of FIG. 5(A) and FIG. 5(A)-1, the silicon oxide film 12 is removed in correspondence to the dicing lines 14 and further from the marginal region 15 such that the silicon surface is exposed in correspondence to these regions. Such an exposure of the silicon surface may be achieved simultaneously to the step for patterning the silicon oxide film for forming contact holes and the like.

Next, in the step of FIG. 5(B), a halogen dry cleaning gas such as chlorine, hydrogen chloride, and the like, are introduced for dry cleaning the surface of the exposed silicon surface as well as the surface of the silicon oxide film 12. For example, the silicon substrate 11 thus processed is exposed to an atmosphere of chlorine under the pressure of 0.1–50 Torr and the temperature of 200°–500° C. Further, ultraviolet radiation having a wavelength of 200–400 nm may be irradiated on the substrate 11 for activating the chlorine molecules.

When the substrate 11, processed to remove the silicon oxide film selectively as described previously, is subjected to the foregoing dry cleaning process of the chlorine gas, an etching occurs in the substrate 11 in correspondence to the exposed surface such as the dicing lines 14 and the marginal area 15, and species such as $SiCl_x$ are formed are a result of the etching reaction as schematically represented in FIG. 5(B). The $SiCl_x$ molecules thus formed are believed to act as a catalyst at the surface of the silicon oxide film 12 that remains on the surface of the substrate 11, wherein electrons in the Cl atoms are supplied to the metal contaminant atoms 16 such as Fe on the surface of the silicon oxide film 12. Thereby, the chemical bond between the oxygen atoms in the silicon oxide film 12 and the contaminant metal atom 16 is reduced and the reaction between the contaminant 16 and the chlorine dry cleaning gas is substantially enhanced. As a result of the effective catalytic action thus achieved, the contaminants are removed effectively even when the contaminant particles 16 are formed of metal halides such as chloride of Fe or Na ($FeCl_x$, for example) that is characterized by the low vapor pressure. See FIGS. 5(C) and 5(D).

It should be noted, however, that the mechanism of the dry cleaning reaction for removing Fe and particularly the action of the $SiCl_x$ molecules on such a dry cleaning reaction is not fully clarified. The possibility that the $SiCl_x$ reacts directly with Fe to form a volatile product is not eliminated. In the foregoing description including other embodiments, the phrase "catalytic action" is used in the sense that such a possibility is included.

It should be noted that the foregoing $SiCl_x$ catalyst is formed as a result of the reaction between the silicon surface exposed in correspondence to the dicing lines 14 and the marginal regions 15, wherein the exposed silicon surface is formed adjacent to the silicon oxide film that is subjected to the dry cleaning process. As the $SiCl_x$ molecules are formed inside the dry cleaning apparatus rather than supplied externally, the deposition of amorphous silicon on the exposed surface of silicon is effectively suppressed. Further, the exposed area of the silicon substrate 11 for the formation of the $SiCl_x$ catalyst is not limited to the foregoing dicing lines 14 and the marginal area 15, but various contact holes may be used for the same purpose. Further, any part of the substrate 11 that can be exposed without substantial effect on the performance of the semiconductor devices, may be used for the same purpose.

It was discovered that the area of the exposed silicon surface is preferably set equal to or larger than the area of the silicon oxide film 12 that is subjected to the dry cleaning process. When the exposed surface area of silicon is not sufficient, the amount of the $SiCl_x$ molecules may become deficient for the effective catalytic action. Further, it was found that the desired catalytic effect can be achieved even when the exposed silicon surface may be covered by a thin, native silicon oxide film, as long as such an oxide film allows a reaction between the real silicon surface and the environmental gas. It should be noted that an etching of semiconductor surface can occur even when the native oxide film remains on the semiconductor surface. See for example Sugino, et al, Extended Abstracts of the 19th Conference on Solid State Devices and Materials, Tokyo, 1987, pp207–210. Further, the exposed surface of silicon is not necessarily be a monocrystalline state but may be in a polycrystal state or amorphous state.

Figure 2A:
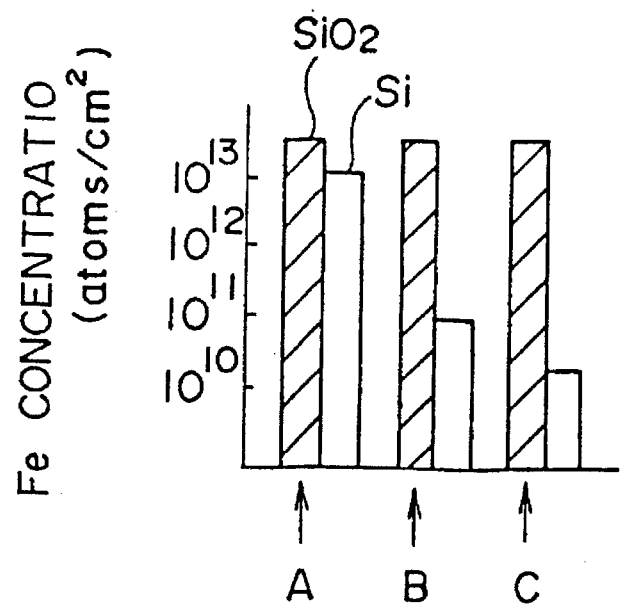
FIGS. 2(A) and 2(B) are diagrams showing the effect that is achieved by the conventional dry cleaning process.
Figure 2B:
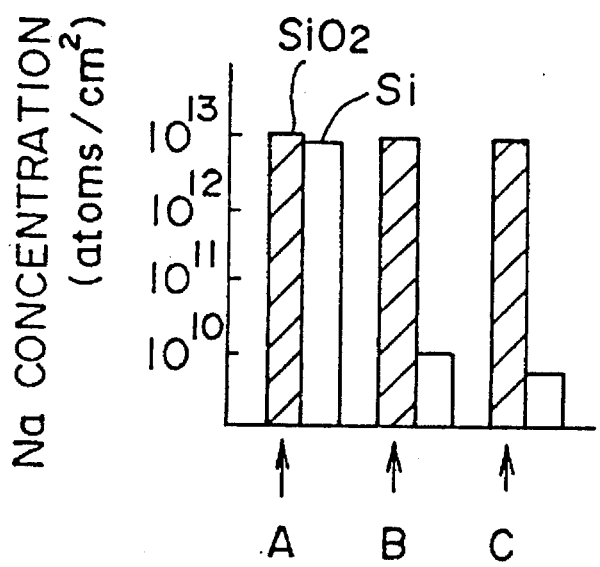
Figure 3:
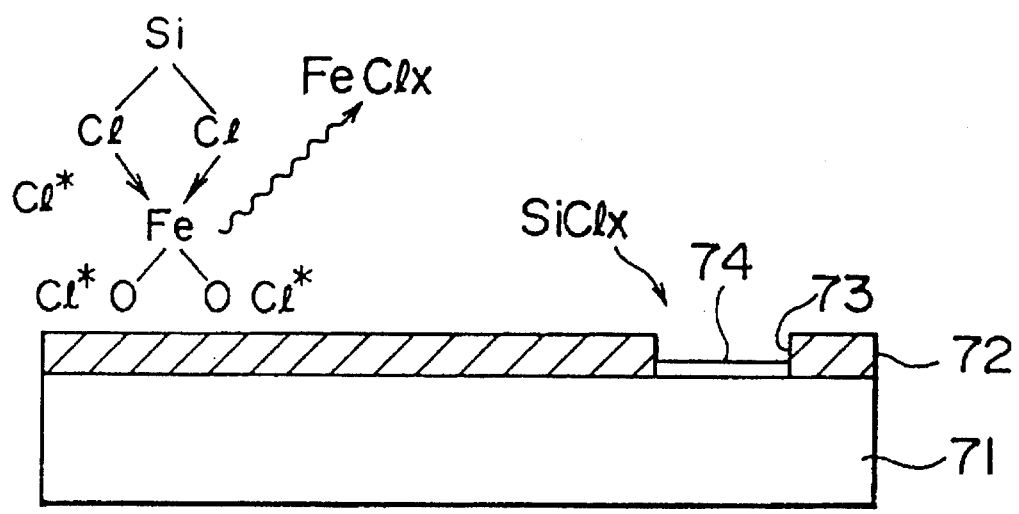
FIG. 3 is a diagram showing a mechanism, discovered previously by the inventors of the present invention, for enhancing the dry cleaning effect by admixing $SiCl_4$ molecules to a dry cleaning gas.
Figure 6A:
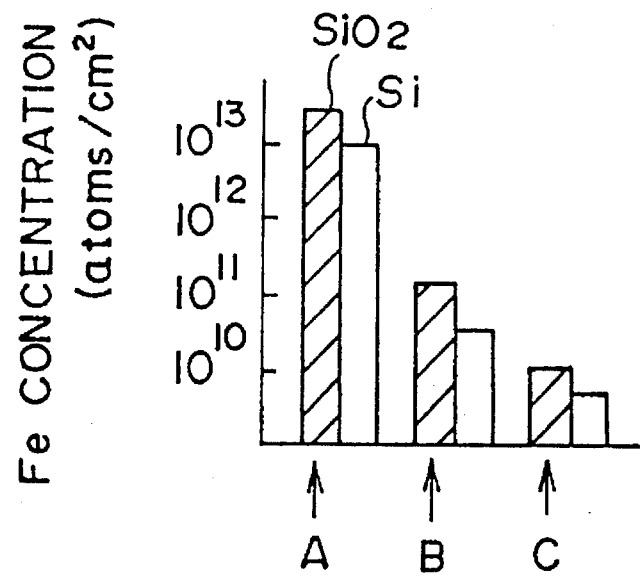
FIGS. 6(A) and 6(B) are diagrams showing the dry cleaning effect that is achieved by the first embodiment.
Figure 6B:
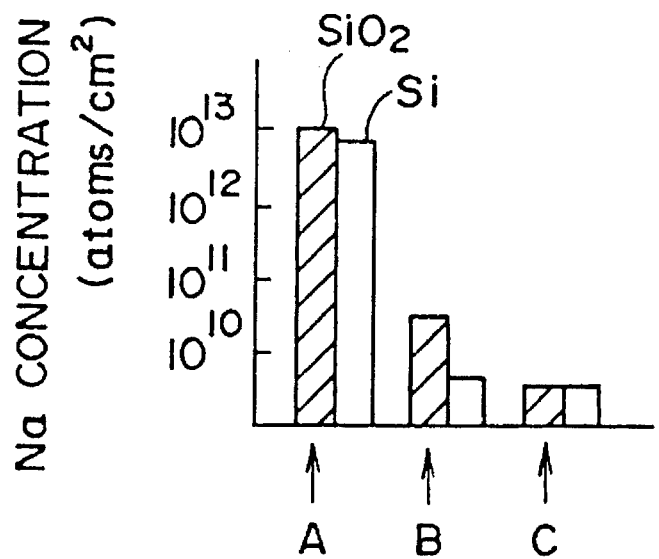

FIGS. 6(A) and 6(B) show the effect of the dry cleaning process achieved by the first embodiment of the present invention, wherein FIG. 6(A) shows the result of an experiment wherein the surface of a semiconductor substrate 11, processed as described previously to expose the silicon surface in correspondence to the dicing lines 14 and the marginal region 15, are contaminated intentionally and cleaned subsequently. Similarly to FIGS. 2(A) and 2(B), the hatched bar graph represents the Fe concentration on the oxide surface while the blank bar graph represents the Fe concentration on the silicon surface. Further, the arrow A indicates the Fe concentration immediately after the intentional contamination while the arrow B indicates the Fe concentration after the dry cleaning at 200° C. Further, the arrow B indicates the Fe concentration after the dry cleaning at 400° C. As can be seen clearly in FIG. 6(A), the concentration level of Fe decreases significantly after the dry cleaning process, both from the silicon oxide surface and from the silicon surface.

FIG. 6(B) shows the result of a similar experiment wherein Na is used as the contaminant in place of Fe. Again, it will be noted that the Na concentration level decreases both from the silicon oxide surface and from the silicon surface as indicated by the hatched bar graph and blank bar graph, wherein the arrow A indicates the state immediately after the intentional contamination, while the arrow B indicates the state after the dry cleaning at 200° C. Further, the arrow C indicates the state after the dry cleaning at 400° C. These diagrams clearly indicate the effectiveness of the dry cleaning process of the present invention also in the case of removing Na contaminants.

Next, a second embodiment of the present invention will be described with reference to FIGS. 7(A)–7(D) that represent the dry cleaning process applicable to those semiconductor substrates wherein exposure of the semiconductor surface over a substantial area is not available, contrary to the case the first embodiment.

In the present embodiment, one or more material pieces 22 containing silicon are disposed adjacent to a semiconductor substrate 21 covered by a silicon oxide film, solely for the purpose of creating the $SiCl_x$ molecules as a result of the etching reaction between the halogen etching gas and the foregoing material. As the material pieces 22 are disposed close to the substrate 21 in a common reaction vessel, the $SiCl_x$ molecules produced as a result of the etching reaction are supplied immediately to the surface of the substrate 21 and causes the desired catalytic action.

Figure 7A:
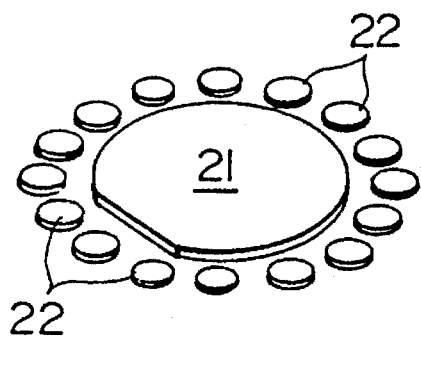
FIGS. 7(A)–7(D) are diagrams showing the dry cleaning process according to a second embodiment of the present invention.
Figure 7B:
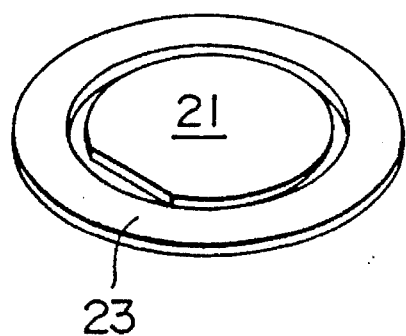

In the example of FIG. 7(A), a number of the material pieces 22 are disposed to surround the substrate 21, while in the example of FIG. 7(B), a ring-shaped material piece 23 is placed to surround the substrate 21. The material piece 22 or 23 may either by a high purity polysilicon block or a high purity single crystal silicon piece.

Figure 7C:
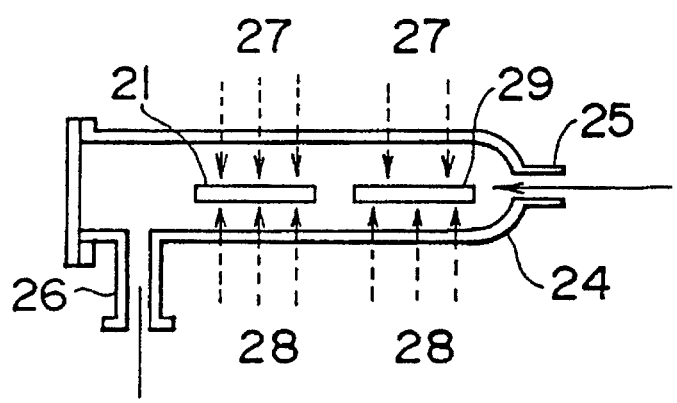

The substrate 21 as well as the material piece(s) 22 are held on a holder and are accommodated in a reaction vessel 24 as illustrated in FIG. 7(C), wherein the reaction vessel 24 is evacuated at an evacuation port 26. Further, a halogen dry cleaning gas 25 is introduced from an inlet 25. In order to activate the halogen gas molecules to facilitate the etching reaction of the material piece 22 for an efficient production of the $SiCl_x$ molecules, a ultraviolet light 27 is irradiated from an external light source. In addition, the substrate 21 and the material piece 22 are heated by an infrared light 28 that is generated by an external lamp (not illustrated).

In the apparatus of FIG. 7(C), it will be noted that one can control the intensity of the ultraviolet radiation and infrared radiation independently such that the production of the $SiCl_x$ molecules is optimized. Further, the number of the material pieces 22 or the area of the ring 23 may be changed as desired.

Figure 7D:
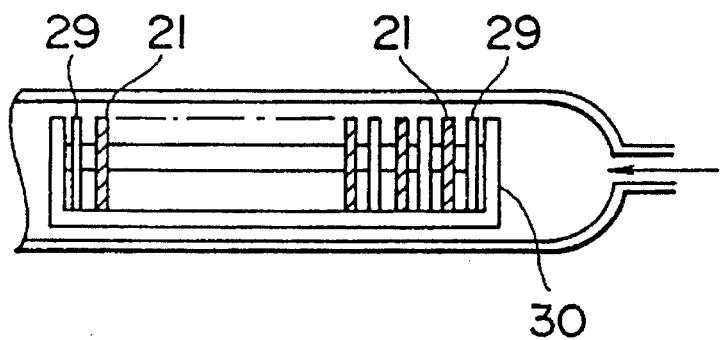

In the example of FIG. 7(D), on the other hand, the substrate 21 is held on a susceptor 30 that also holds a number of silicon discs 29 that have an exposed silicon surface. There, the substrate 21 and the susceptor 30 are disposed alternately such that the silicon oxide surface of the substrate 21 faces the exposed silicon surface of the silicon disc 29 with a minute separation therefrom. Thereby, the $SiCl_x$ molecules, produced as a result of the etching reaction between the halogen dry cleaning gas and the exposed silicon surface of the disc 29, are supplied immediately to the silicon oxide surface of the substrate 21 and enhances the dry cleaning effect. In the construction of FIG. 7(D), an effective dry cleaning is achieved while using conventional dry cleaning apparatus as it is, without making any change to the construction of the apparatus.

It should be noted that the dry cleaning process of the present invention can be further enhanced by implementing an ion implantation on the exposed surface of the silicon disc 29. Thereby, the single crystal structure of the silicon disc 29 is changed to a reactive polycrystal or amorphous structure, and the efficiency of production of the $SiCl_4$ molecules is substantially improved. For example, Si ions may be implanted with a dose of $2 \times 10^{14} - 1 \times 10^{15}$ dose/cm$^3$ and the acceleration energy of about 20 keV. Further, such an ion implantation process may be achieved also to the silicon piece 22 or to the silicon ring 23 for increasing the reactivity.

In the ion implantation process described above, dopants other than Si, particularly the n-type dopants such as As or P, are effective for enhancing the production of the $SiCl_x$ molecules. By using the ion implantation of the n-type dopants, the etching rate of silicon increases significantly, indicating the increased rate of the production of the $SiCl_x$ molecules. For example, As or P ions are introduced into the substrate 29 with a dose of $2 \times 10^{14} - 2 \times 10^{15}$ dose/cm$^3$. Further, a similar ion implantation may be achieved also to the silicon piece 22 or to the silicon ring 23. Furthermore, the ion implantation may be applied to the substrate 11 used in the first embodiment in correspondence to the dicing lines 14 and in correspondence to the marginal region 15.

In the foregoing first and second embodiments, the reaction between the chlorine gas and silicon has been used for producing the $SiCl_x$ molecules for promoting the dry cleaning effect. However, the species that enhances the dry cleaning reaction is not limited to $SiCl_4$ molecules but other silicon halide molecules may also be employed. Associated therewith, the gas for producing the halide molecules upon reaction with silicon is not limited to chlorine but other halogen gases such as bromine ($Br_2$) and hydrogen bromide (HBr) may also be employed. According to the dry cleaning process of the present invention, no substantial etching occurs on the surface of the silicon oxide film. Further, by selecting the dry cleaning condition appropriately, one can minimize the amount of etching occurring upon the exposed surface of silicon.

On the other hand, depending on the condition, it was found that there are cases wherein the catalytic effect of the $SiCl_x$ molecules is not sufficient. More specifically, the foregoing catalytic effect appears conspicuously only when the temperature exceeds about 300° C.

In order to eliminate the foregoing problem and to improve the efficiency of the dry cleaning process, a third embodiment of the present invention provides a process wherein a halide gas of an element selected from the group IIIa elements, group IVa elements and the group Va elements such as Ga, Si, Ge, As, and the like, is used as a catalytic gas. Typically, the halide gas is used in combination with the halogen dry cleaning gas, such that the halide gas releases the foregoing element in the vicinity of the oxide surface that is subjected to the dry cleaning process. There, the strong catalytic action associated with the released element promotes the reaction between the metal contaminants and the halogen dry cleaning gas to produce a volatile product gas of the contaminants.

More specifically, the halide, particularly chloride, of the element such as Ga, Ge or As acts not only as the donor of electrons as in the case of $SiCl_4$ molecules but also as the donor of chlorine atoms ($Cl^-$) for supplying $Cl^-$ directly to the metal contaminant to cause a metal halide reaction therebetween. The deficiency of the halogen atoms thus occurred in turn is supplemented by the halogen dry etching gas, and the elements such as Ga continue to exist in the form of halide. Thus, halides, particularly chlorides of the group IIIa element, the group IVa element or the group Va element, functions both as a donor of electrons and a donor of chlorine atoms, and the catalytic action for the dry cleaning is substantially improved. Thereby, the temperature of the dry cleaning is reduced significantly and a highly purified surface is obtained for the oxide films.

In the present embodiment, it should be noted that one can achieve the dry cleaning of the silicon oxide surface without causing substantial etching on the oxide surface.

Figure 8:
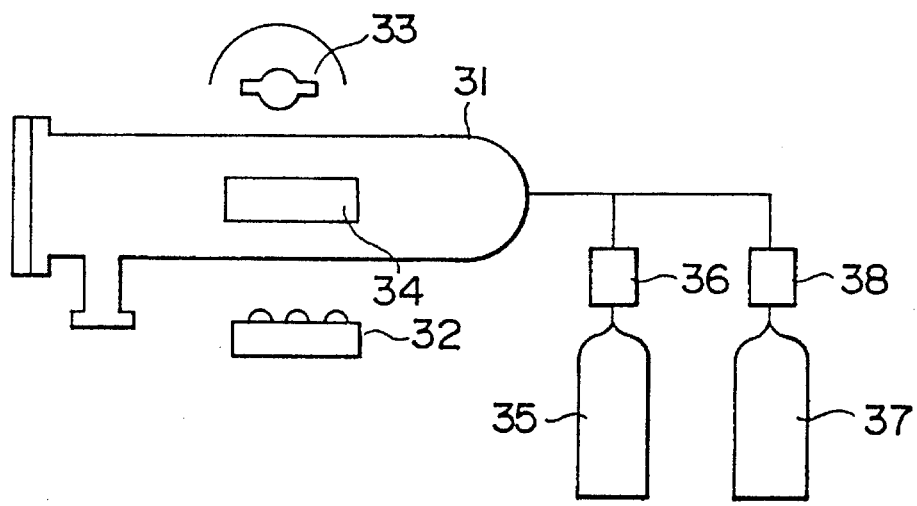
FIG. 8 is a diagram showing an apparatus used for a dry cleaning process according to a third embodiment of the present invention.

FIG. 8 shows the apparatus used for the third embodiment of the present invention.

Referring to FIG. 8, the apparatus includes a reaction vessel 31, an infrared radiation source 32 for heating the reaction vessel 31, an ultraviolet radiation source 33 for irradiating ultraviolet radiation to the reaction vessel 31 for activating a catalytic action therein, a susceptor 34 for holding a semiconductor substrate that is subjected to the dry cleaning process, a chlorine gas cylinder 35 for supplying a chlorine gas to the reaction vessel 31 via a regulator 36, and a gallium chloride cylinder 37 for supplying a $GaCl_3$ gas to the reaction vessel 31 via a regulator 38.

In an experiment conducted for demonstrating the effect of the present embodiment, the surface of a silicon oxide film, formed on a silicon substrate with a thickness of about 20 nm, was intentionally contaminated by dipping the substrate in a Fe-containing aqueous solution of ammonia ($NH_4OH$) and hydrogen peroxide ($H_2O_2$) for 5–10 minutes. The composition of the aqueous solution was adjusted to a ratio of $NH_4OH:H_2O_2:H_2O=1:1:4$. After, pulling up from the solution, the substrate was washed in a deionized water and dried subsequently. It was confirmed that the silicon oxide surface of the substrate thus processed is contaminated by Fe with a concentration level of $10^{13}$ atoms/cm$^2$.

The substrate thus intentionally contaminated was then placed in the reaction vessel 31. After evacuation of the reaction vessel 31, the chlorine gas ($Cl_2$) was introduced from the cylinder 35 with a regulated flowrate of 100-1 ml/min. Simultaneously, the $GaCl_3$ gas was introduced from the cylinder 37 at the flowrate of 10-0.1 ml/min, such that the total pressure inside the reaction vessel 31 is held at 100-0.1 Torr. Next, the contaminated substrate held on the holder 34 was heated to a temperature of 200°–700° C. by activating the infrared radiation source 32. After the temperature of the substrate has reached a predetermined temperature, the ultraviolet source 33 was activated for about 30 seconds to irradiate a ultraviolet radiation having a wavelength of 200–400 nm with a power of 10–30 mW/cm$^2$.

After the dry cleaning process thus achieved, it was observed that the Fe concentration level on the surface of the silicon oxide film has reduced to the level of $10^{10}$ atoms/cm$^2$, indicating a significant cleaning effect. It should be noted that the foregoing level of $10^{10}$ atoms/cm$^2$ corresponds to the detection limit of the contamination measurement. Further, no substantial etching occurred on the silicon oxide surface that is subjected to the dry cleaning process.

Figure 9:
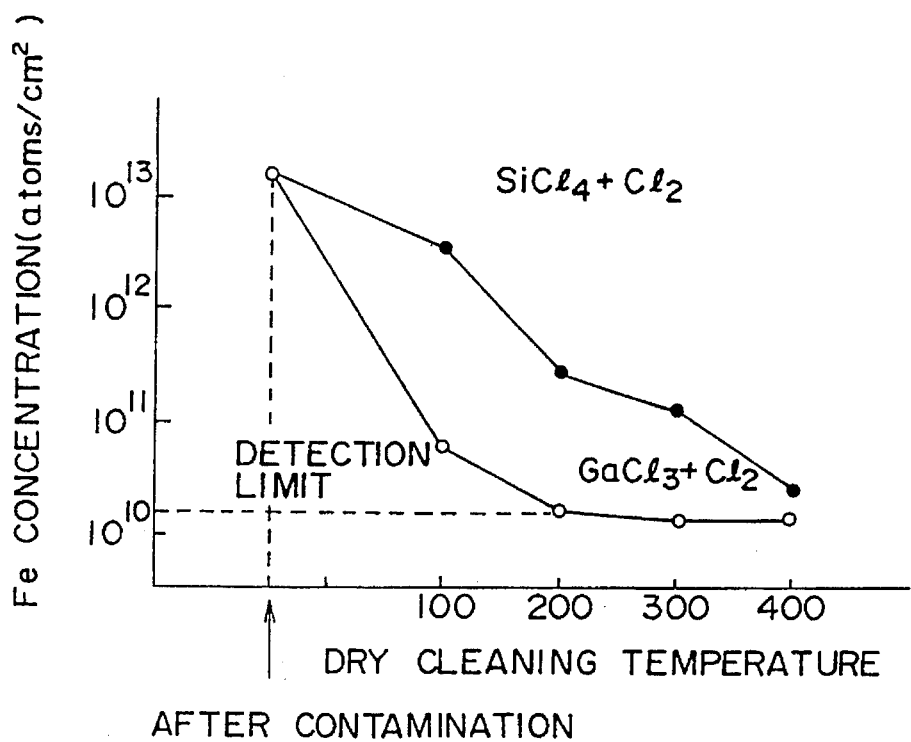
FIG. 9 is a diagram showing the dry cleaning effect achieved by the third embodiment of the present invention.

FIG. 9 shows the effect of the dry cleaning that is achieved by the present embodiment, in comparison with an experiment wherein $SiCl_4$ gas is used as the catalyst.

Referring to FIG. 9, the vertical axis represents the concentration level of Fe on the silicon oxide surface and the horizontal axis represents the temperature of the dry cleaning. It will be noted from FIG. 9 that the contamination can be eliminated more or less completely without using the temperature exceeding 200° C. in the present embodiment, while in the embodiment that uses $SiCl_4$ for the catalyst, one has to increase the processing temperature above 400° C. in order to obtain a satisfactory result.

Figure 10:
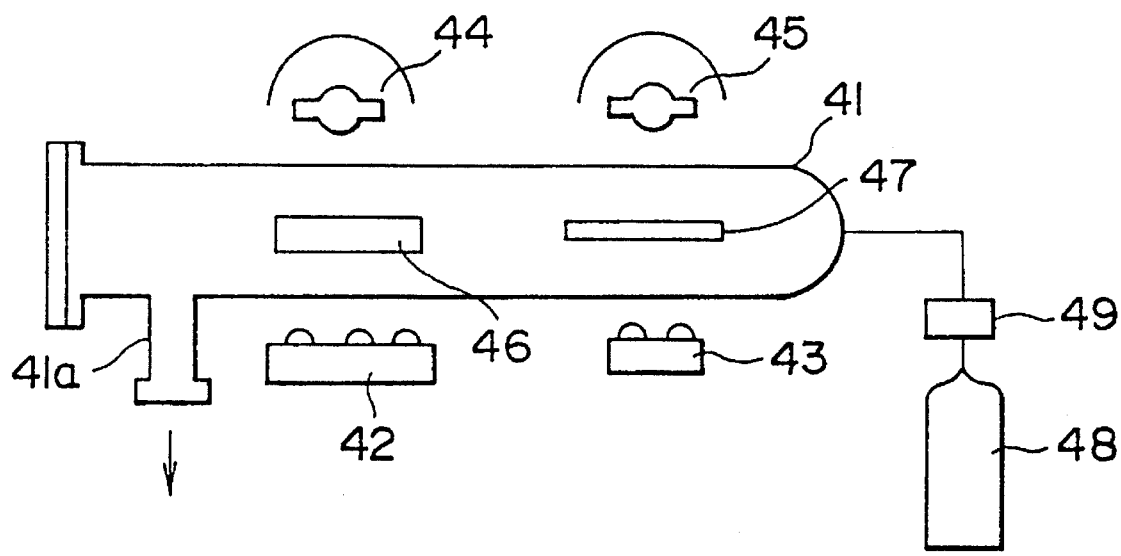
FIG. 10 is a diagram showing an apparatus used for a dry cleaning process according to a fourth embodiment of the present invention.

FIG. 10 shows a fourth embodiment of the present invention, wherein the dry cleaning process is conducted in an elongated or tubular reaction vessel 41 that is evacuated at a port 41a provided at an axial end part of the vessel 41. Below the reaction vessel 41, an infrared radiation source 42 and another infrared radiation source 43 are disposed along the axial direction of the vessel 41. Similarly, a ultraviolet radiation source 44 and another ultraviolet radiation source 45 are disposed above the reaction vessel 41 along the axial direction of the vessel 41. Further, a chlorine gas cylinder 48 is connected to the reaction vessel 41 via a regulator 49 at a second axial end part of the reaction vessel 41, and the $Cl_2$ gas thus introduced into the reaction vessel 41 flows from the second axial end to the evacuation port 41a at the first axial end. Thereby, the infrared source 42 and the corresponding ultraviolet source 44 are disposed at the downstream side with respect to the infrared source 42 and the corresponding ultraviolet source 45.

In the reaction vessel 41, a first holder 47 for holding a GaAs substrate is provided in correspondence to the infrared source 43 and the ultraviolet source 45 such that the GaAs substrate is heated to a desired temperature and irradiated with the ultraviolet radiation simultaneously. Further, at the downstream side of the holder 47, a second holder 46 is provided in the reaction vessel 41 for holding a semiconductor substrate that is subjected to the dry cleaning process. There, the holder 46 is disposed between the infrared source 42 and the ultraviolet source 44 such that the substrate on the holder 46 is heated to a desired temperature and irradiated by the ultraviolet radiation simultaneously. Thereby, the $Cl_2$ gas introduced into the reaction vessel 41 causes an etching reaction of the GaAs substrate 47 at first and produces $GaCl_3$ molecules. The $GaCl_3$ molecules thus produced are then transported through the vessel 41 with the flow of the $Cl_2$ gas and reaches the substrate held on the holder 46. There, the $GaCl_3$ molecules interact with the oxide surface of the substrate and enhances the dry cleaning reaction according to the mechanism described previously.

In an experiment conducted with the apparatus of FIG. 10, a silicon oxide film was formed on the substrate by a thermal oxidation process. Further, the silicon oxide film thus formed was contaminated intentionally before mounting on the holder 46 by a contamination process similar to the process described previously, such that the oxide surface is contaminated by Fe with the concentration level of $10^{13}$ atoms/cm². After evacuating the reaction vessel 41, the $Cl_2$ gas was introduced from the gas cylinder 48 with a flowrate set to 100–1 ml/min by the regulator 49 such that the internal pressure of the vessel 41 is set to 100–0.1 Torr. Further, the infrared sources 42 and 43 were activated such that the substrate on the holder 46 is set to a temperature of 200°–700° C. and such that the GaAs substrate on the holder 47 is set to a temperature of 100°–400° C. Upon stabilization of the temperature, the ultraviolet sources 44 and 45 are activated to irradiate ultraviolet radiation directly on the surface of the substrates that are held on the holders 46 and 47, with a wavelength of 200–400 nm and the optical power of 10–30 mW/cm². The irradiation of the ultraviolet light is continued for about 30 minutes. As a result of the foregoing dry cleaning process, it was observed that the Fe concentration level has decreased to the level of $10^{10}$ atoms/cm², in conformity with the result shown in FIG. 9.

In the embodiment of FIG. 10, it should be noted that the energy supply system for supplying thermal energy and optical energy to the GaAs substrate for stimulating the halide formation, is provided independently to the energy supply system for supplying the thermal energy and the optical energy to the substrate that is subjected to the dry cleaning process. Thereby, one can optimize the dry cleaning condition by controlling both of the energy supply systems independently.

In the present embodiment, one may supply two or more halides of the group IIIa elements, group IVa elements and the group Va elements together with a halogen dry cleaning gas with an optimized mixing ratio. When implementing such a construction, two or more substrates of the group IIIa element, group IVa element and the group Va element, with mutually different compositions, are disposed in the reaction vessel 41 and are activated independently such that the dry cleaning condition is optimized. Particularly, the embodiments of FIGS. 8 and 10 are proved to be effective for eliminating metal contaminants from the oxide surface at the low processing temperature such as 200° C.

The present embodiment is particularly effective when the dry cleaning process is applied to the surface of the substrate that produces the halide molecules. Further, the halogen gas that can be applicable to the present embodiment is not limited to the chlorine gas but pure fluorine gas ($F_2$) may also be used. It should be noted that high purity fluorine gas does not cause substantial etching of the silicon oxide surface. Thus, the halide molecules that are produced as a result of the etching reaction of the halogen gas with the substrate that contains the group IIIa element, the group IVa element or the group Va element, includes $GaCl_3$, $SiCl_4$, $GeCl_4$, $AsCl_3$, $GaF_3$, $SiF_4$ and $GeF_4$, wherein these halide molecules are supplied under the condition set such that no substantial etching of the silicon oxide surface occurs. It should be noted that fluorides such as $SiF_4$ are stable because of the large electronegativity and acts as a Lewis acid and establishes a strong bond with Fe by supplying electrons.

In addition, the halide molecules may be supplied alone, without mixing to the halogen etching gas. In relation to this modification, one can also use a halide gas containing hydrogen such as $SiHCl_3$, $SiH_2Cl_2$. The use of these hydrogen-containing halide gas is advantageous in view point of the low decomposition temperature, high vapor pressure, and improved purity of the gas.

Next, a fifth embodiment of the present invention will be described with reference to FIGS. 11 and 12 respectively showing a dry cleaning apparatus that is used in the present embodiment and a flowchart of the dry cleaning process.

Figure 11:
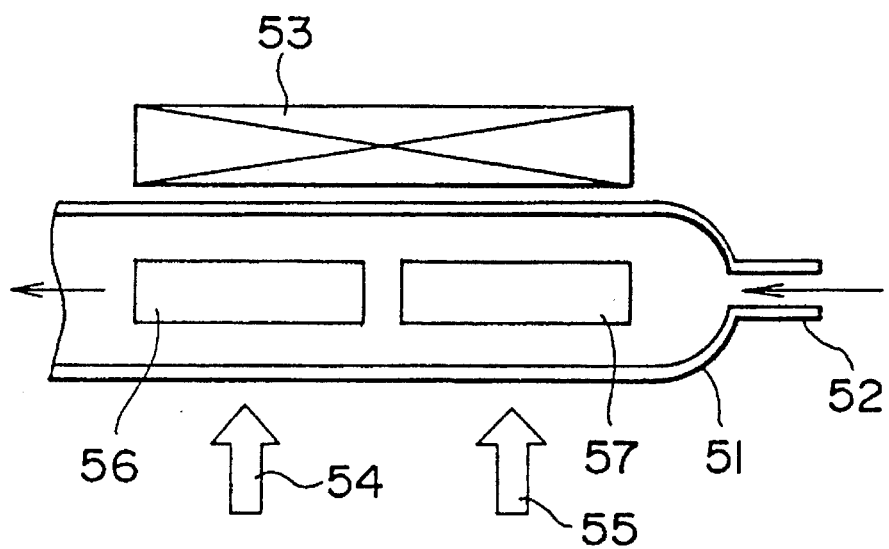
FIG. 11 is a diagram showing an apparatus used for a dry cleaning process according to a fifth embodiment of the present invention.

Referring to FIG. 11 first, the apparatus includes a reaction vessel 51 that is supplied with a halogen gas at an inlet port 52. The gas thus introduced flows through the vessel 51 in the axial direction thereof, wherein there are disposed a first substrate 56 and a second substrate 57 in the reaction vessel 51, with the substrate 57 located at the upstream side with respect to the substrate 56. Similarly to the previous embodiment, the substrate 57 produces the halide molecules and the substrate 56 experiences the dry cleaning process that is assisted by the halide molecules produced at the substrate 57. Thus, the substrate 57 is formed of a material that contains the group IIIa element, group IVa element or the group Va element such as GaAs. Further, an external heating device 53 is disposed adjacent to the reaction vessel 51 for heating the substrates 56 and 57, and ultraviolet radiation is applied to the substrates 56 and 57 from the downward direction.

Next, the step-by-step process of the present embodiment will be described with reference to the flowchart of FIG. 12.

Figure 12:
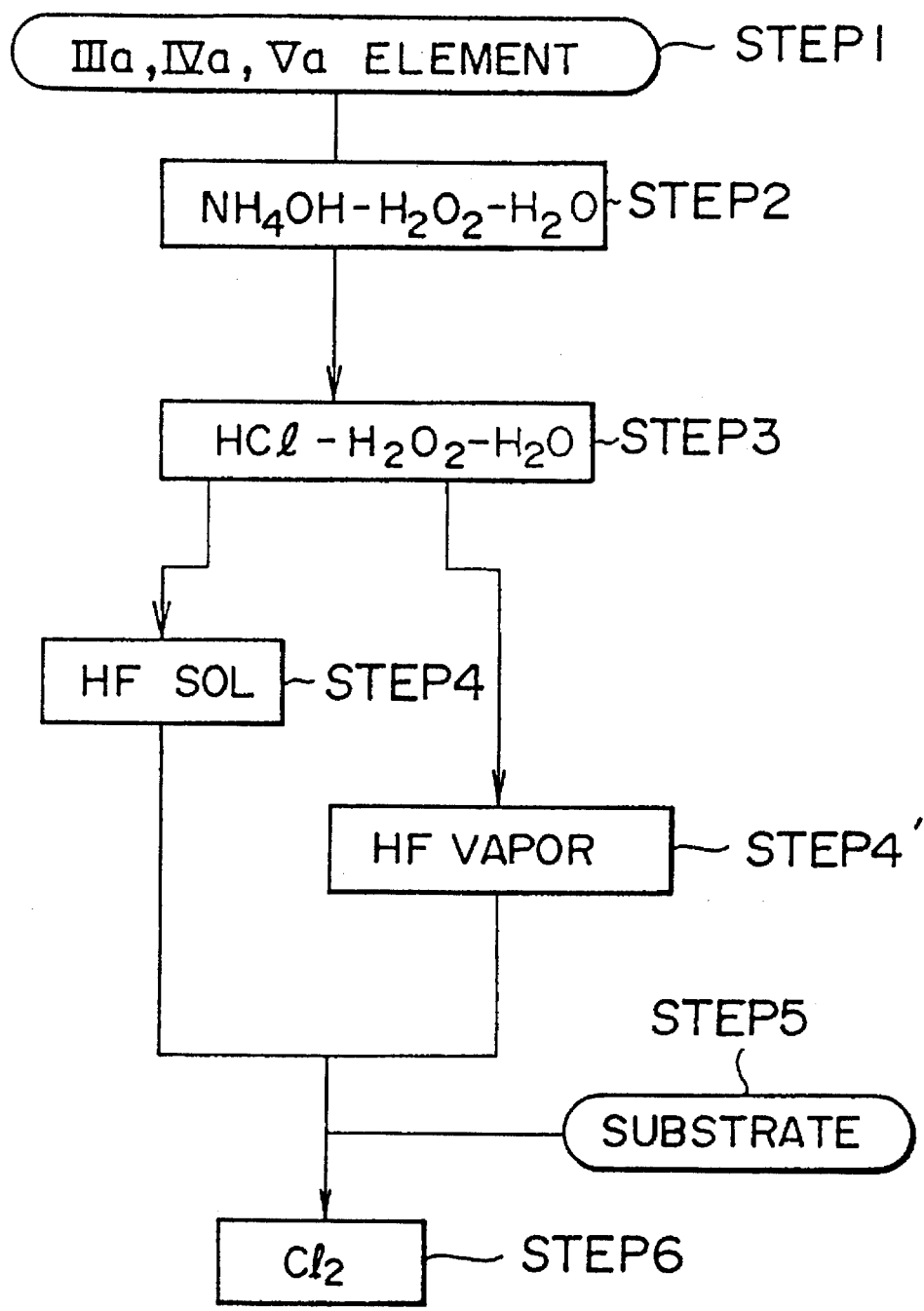
FIG. 12 is a flowchart showing the fifth embodiment of the present invention.

Referring to FIG. 12, the substrate 57 such as silicon is prepared in a suitable form such as a disk in a step 1 and is immersed in a heated aqueous solution of ammonia and hydrogen peroxide known as RCA solution, for about 10 minutes, in correspondence to a step 2, to remove fine particles from the surface of the substrate 57. Of course, one can use materials other than silicon such as GaAs, InP, Ge, and the like, for the substrate 57.

Next, the substrate 57 thus processed is rinsed in a purified water and immersed in a step 3 in a solution of hydrochloric acid containing hydrogen peroxide, for about ten minutes. After pulling up from the solution, the substrate 57 is rinsed in a purified water for ten minutes to remove any contaminants remaining on the surface. Further, after the step 3, the substrate 57 thus processed is immersed in a step 4 into a hydrofluoric acid solution of 10% concentration level for about 30 seconds and rinsed in a purified water for another 10 minutes. Thereby, any native oxide film remaining on the surface of the substrate 57 is removed.

As a result of the foregoing steps 1–3, the particles, contaminants and the native oxide film are removed successfully from the surface of the substrate 57.

Next, the substrate 57 thus processed is placed in the reaction vessel 51 of FIG. 11 together with the substrate 56 that is subjected to the dry cleaning process in a step 5, and the reaction vessel 51 is evacuated. Further, after the pressure inside the reaction vessel 51 has reached a sufficient level, a $Cl_2$ dry cleaning gas is introduced into the vessel 51 from the inlet 52 in correspondence to a step 6 such that the pressure inside the vessel 51 is maintained at a suitable level typically in the range between 100 Torr–0.1 Torr. After the step 6, the temperature of the reaction vessel 51 is raised to a level of 200°–700° C., and the ultraviolet irradiation schematically shown as numerals 54 and 55 is activated with a wavelength of 200–400 nm and the intensity of 10–500 mW/cm$^2$ for about 30 seconds. Thereby, the dry cleaning process assisted by the halogen molecules takes place and the substrate surface is effectively cleaned even when the surface is contaminated by Fe or Na.

In the dry cleaning process of FIG. 12, it should be noted that one can replace the step 4 for dipping the substrate 57 into the HF solution by a step 4' wherein the substrate 57 is exposed to a vapor of HF for removing the surface oxide film.

According the present embodiment, one can increase the rate of halide production at the surface of the substrate to about five times as large as the previous embodiments that do not use the surface preparation of the substrate 57. Thereby, one can obtain an effect that has been achieved in the previous embodiments after processing at 700° C. for 120 seconds under the irradiation of ultraviolet light, by a processing at 550° C. for 30 seconds. Further, the complicated trial and error process necessary for finding out the optimum dry cleaning condition depending upon the state of the native oxide film or contaminants on the surface of the substrate 27, is no longer necessary and one can achieve the dry cleaning process with an excellent reproducibility.

In the process of the foregoing third through fifth embodiment, it was found that there occurs occasionally a deposition of thin halide layer of the elements such as Ga, Si, Ge, As, and the like, supplied from the source substrate of the group IIIa, IVa, and Va elements such as the substrate 47 or 57, on the exposed part of the substrate 26 that is subjected to the dry cleaning process. For example, a thin film of $GaCl_3$ tends to be formed when a $GaCl_3$ gas is admixed with a $Cl_2$ dry cleaning gas. When such a deposition occurs, the conductivity type of the semiconductor substrate is changed to the p-type in correspondence to the exposed region. This problem can be eliminated by a continuous supply of the halogen dry cleaning gas after the dry cleaning is completed and the supply of the halide molecules stopped. Thereby, the halides of the group IIIa, IVa and Va elements remaining on the surface of the substrate 46 or 56 is removed by the halogen dry cleaning gas. Hereinafter, embodiments effective for removing remaining IIIa, IVa or Va elements will be described.

Next, a sixth embodiment of the present invention will be described with reference to FIGS. 13(A) and 13(B), wherein these drawings show the variation of pressure inside the reaction vessel with time. In the present embodiment, the dry cleaning apparatus shown in FIG. 8 can be used and the process is conducted similarly to the third embodiment.

Figure 13A:
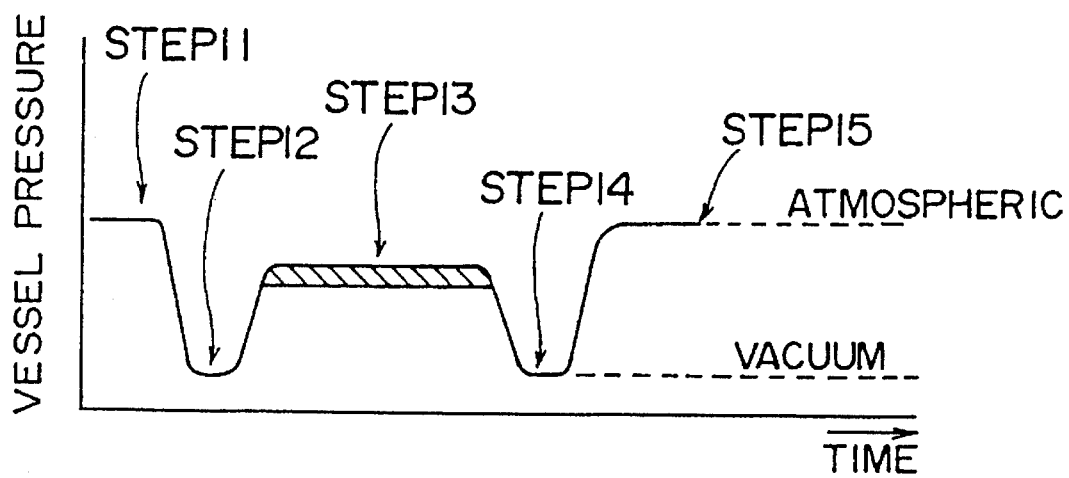
FIGS. 13(A) and 13(B) are time charts showing a dry cleaning process according to a sixth embodiment of the present invention.

Referring to FIG. 13(A) showing the third embodiment described already at first, the substrate 34 is loaded on the reaction vessel 31 in correspondence to a step 11 wherein the reaction vessel 31 is opened and the pressure inside the reaction vessel 31 equilibrated with the environmental pressure for loading the substrate 34.

Next, in a step 12, the reaction vessel 31 is evacuated, and the dry cleaning gas such as $Cl_2$ is introduced into the reaction vessel 31 in a step 13 together with a halide gas such as $GaCl_3$. As already described before, the $Cl_2$ gas is supplied with a flowrate of 100-1 ml/min, while the $GaCl_3$ gas is supplied with a flowrate of 10-0.1 ml/min, such that the pressure inside the reaction vessel 31 is maintained at 100-0.1 Torr. Further, the substrate 34 is heated to a temperature of 200°–500° C. and irradiated with a ultraviolet light having a wavelength of 200–400 nm, with a power of 10–30 mW/cm$^2$.

After the step 13, the reaction vessel 51 is evacuated again in a subsequent step 14 for removing the remaining halogen gas, and the reaction vessel 51 is opened in correspondence to a step 15 for replacing the substrate 56.

Figure 13B:
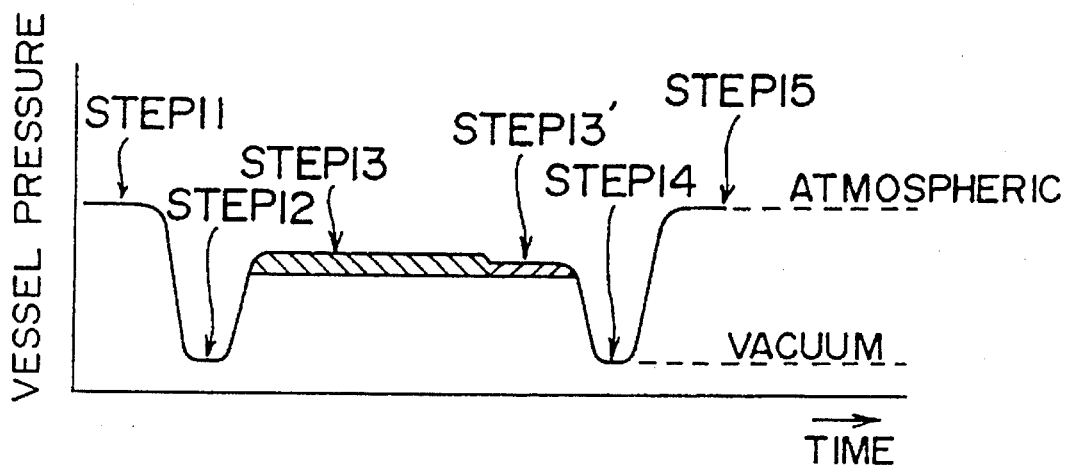

FIG. 13(B) shows the sixth embodiment in comparison with FIG. 13(A), wherein the process is substantially similar to FIG. 13(A) except for one point that a step 13' is interposed at the end of the step 13. In the step 13', the supply of the $GaCl_3$ gas is interrupted while maintaining the supply of the $Cl_2$ gas and simultaneously maintaining the temperature of the substrate 34 and the ultraviolet irradiation unchanged. As a result, any deposition of Ga remaining on the substrate surface is removed as a result of the etching reaction provided by the $Cl_2$ gas. The process of the step 13' is continued for about 15 seconds. After the step 13', the processes such as irradiation of the ultraviolet radiation, heating of the substrate 34 and supply of the chlorine gas are interrupted and the evacuation step 14 is conducted.

The foregoing process shown in FIG. 13(B) is applicable also to the embodiment that uses the dry cleaning apparatus of FIG. 10 or FIG. 11. In this case, a step corresponding to the step 13' is conducted such that the irradiation and heating of the GaAs substrate 47 or 57 are interrupted in response to the end of the step 13 while continuously supplying the dry cleaning gas. Further, the ultraviolet irradiation and heating of the substrate 56 is continued. After the step 13', the step 14 is conducted similarly to the previous embodiment. According to the present modification, too, one can remove the elements such as Ga deposited on the silicon oxide surface effectively.

In an alternative to the sixth embodiment, one may modify the process of FIG. 13(B) such that the irradiation of the ultraviolet radiation and heating of the substrate 47 are interrupted once, together with the interruption of supply of the dry cleaning gas, while maintaining simultaneously the ultraviolet irradiation and the heating against the substrate 46. After the reaction vessel 41 is evacuated to the level of about 1 mTorr as a result of interruption of the supply of the $Cl_2$ gas, the $Cl_2$ gas is introduced again to recover the original internal pressure and hold the state for about 15 seconds. Thereafter, the ultraviolet irradiation, the infrared heating and the supply of $Cl_2$ gas are interrupted with respect to both of the substrates 46 and 47, and the vessel 41 is evacuated in correspondence to the step 14. According to this procedure, too, one can remove the residual elements from the surface of the substrate 46. Further, one may interrupt the ultraviolet and infrared irradiation against the substrate 46 when evacuating the reaction vessel 41 and reactivate the same upon introduction of the $Cl_2$ gas conducted after the evacuation process. In any of the foregoing modifications, the group IIIa, IVa or Va elements remaining on the dry-cleaned oxide surface can be removed effectively by eliminating the dwelling of $GaCl_3$, and a very pure oxide surface can be obtained.

In any of the foregoing embodiments, one may introduce an inert gas such as Ar in addition to the halogen dry cleaning gas. For example, Ar may be introduced with a flowrate of 100–1 ml/min in correspondence to the flowrate of halogen etching gas that is supplied with a flowrate of 100–1 ml/min. The Ar gas is kept on flowing when the reaction vessel is evacuated. Thereby, the desired purging effect is achieved in the matter of 10 seconds.

In the foregoing sixth embodiment as well as in the foregoing embodiment of FIG. 8, one may use a nitrogen trifluoride gas ($NF_3$) as a dry cleaning gas that is introduced in combination with the $GaCl_3$ gas. After the foregoing dry cleaning process is achieved with the assistance of the $GaCl_3$ molecules, one may introduce chlorine gas alone for the purpose of purging and further for removing the Ga residuals. In addition, a similar dry cleaning effect is achieved by using gases other than the foregoing halide gas such as carbon monoxide (CO), carbon dioxide ($CO_2$), water ($H_2O$), nitrogen oxide ($NO_x$), and hydrides such as silane ($SiH_4$) and germane ($GeH_4$), as an additive to the dry cleaning gas. Further, one may change the dry cleaning gas when used in combination with the halide gas and when used alone after the dry cleaning process for removing the residual element that has been contained in the halide gas.

Next, a seventh embodiment of the present invention will be described for removing metal contaminants from a semiconductor surface such as silicon.

Generally, although the foregoing dry cleaning process of the present invention is useful for dry-cleaning the oxide surface, there exists a problem in that a dry etching occurs inevitably on the exposed semiconductor surface. Thus, unless such an etching is allowed, the use of the foregoing dry cleaning process against the semiconductor substrate that includes an exposed semiconductor surface raises a problem.

In order to cope with the problem, the present invention provides a process to form a thin oxide film on the exposed semiconductor surface by a thermal oxidation process. Typically, the thickness of the oxide film is less than 10 nm and the loss of the surface part of the semiconductor surface is not serious to most of the applications. Such a thin oxide film can be formed by exposing the semiconductor surface to an oxidizing gas such as $O_2$ or to an oxidizing vapor such as $H_2O$ or $H_2O_2$ under the irradiation of ultraviolet radiation having a wavelength of 180–450 nm. The substrate may be heat-treated at a temperature up to 800° C. With the formation of the silicon oxide film, the metal contaminants are now transferred to the surface of the silicon oxide film thus formed. Once the silicon oxide film is formed as such, the metal contaminants are removed by applying the dry cleaning process according to any of the previous embodiments. Further, after the dry cleaning process, the silicon oxide film is removed.

Further, the present invention is not limited to the embodiments described heretofore, but various variations and modifications may be made without departing from the scope of the invention.

What is claimed is:

1. A dry cleaning process for removing metal contaminants from a surface of a silicon oxide film such that no substantial etching of said oxide film occurs, said oxide film covering a surface of a substrate for protecting said substrate from a reaction with species that are contained in an environmental atmosphere in which said substrate is held, said process comprising the steps of:

forming a reaction area on said silicon oxide film such that a silicon surface is formed on said substrate in correspondence to said reaction area;

supplying a dry cleaning gas selected from a group consisting essentially of chlorine, bromine, hydrogen chloride, hydrogen bromide and a mixture thereof, to said oxide film including said reaction area, to produce silicon halide molecules as a result of a reaction between said dry cleaning gas and said silicon surface;

supplying said silicon halide molecules to a surface of said oxide film; and removing metal contaminants existing on said surface of said oxide film as a result of a reaction between said metal contaminants and said dry cleaning gas under a presence of silicon halide molecules, said removing metal contaminants being conducted such that no substantial etching of said oxide film occurs.

2. A method as claimed in claim 1, wherein said forming a reaction area comprises a step of removing said oxide film in correspondence to said reaction area such that said surface of said substrate can react with said dry cleaning gas in correspondence to said reaction area.

3. A method as claimed in claim 2, wherein said forming a reaction area is conducted such that said surface of said substrate is exposed in correspondence to said reaction area.

4. A method as claimed in claim 2, wherein said forming a reaction area is conducted such that said surface of said substrate is covered by a native oxide film in correspondence to said reaction area to an extent which allows reaction between said surface of said substrate and chemical species in the environment.

5. A method as claimed in claim 2, wherein said forming a reaction area comprises a step of modifying said surface of said substrate to an amorphous state in correspondence to said reaction area by implementing an ion implantation process to said reaction area.

6. A method as claimed in claim 5, wherein said step of modifying said surface comprises a step of incorporating an n-type dopant selected from the group consisting of As and P to said surface in correspondence to said reaction area.

7. A method as claimed in claim 1, wherein said forming a reaction area comprises a step of forming a surface of polysilicon on said substrate in a state such that said surface of polysilicon can react with said dry cleaning gas.

8. A method as claimed in claim 1, wherein said forming a reaction area comprises a step of forming a surface of amorphous silicon on said substrate in a state such that said surface of amorphous silicon can react with said dry cleaning gas.

9. A dry cleaning method for removing metal contaminants from a surface of a silicon oxide film that covers a substrate such that no substantial etching of said oxide film occurs, comprising the steps of:

providing a material containing silicon in a vicinity of said oxide film, said material being placed in a common environmental atmosphere with said oxide film;

supplying a dry cleaning gas selected from a group consisting essentially of chlorine, bromine, hydrogen chloride, hydrogen bromide and a mixture thereof, to said surface of said oxide film and further to said material to produce silicon halide molecules as a result of a reaction between said dry cleaning gas and said material;

supplying said silicon halide molecules to a surface of said oxide film; and removing metal contaminants existing on said surface of said oxide film as a result of a reaction between said metal contaminants and said dry cleaning gas under a presence of said silicon halide molecules, said removing metal contaminants being conducted such that no substantial etching of said oxide film occurs.

10. A method as claimed in claim 9, wherein said material has a surface area for reaction with said dry cleaning gas, wherein said surface area of said material is set at least equal to a surface area of said silicon oxide film that is subjected to a dry cleaning process by said dry cleaning gas.

11. A method as claimed in claim 9, wherein said providing said material containing silicon is conducted such that said material surrounds said substrate.

12. A method as claimed in claim 9, wherein said material containing silicon is disposed at an upstream side of said substrate with respect to a flow of said dry cleaning gas.

13. A method as claimed in claim 9, wherein said supplying said silicon halide molecules is assisted by a step of supplying energy to said material and further by a step of supplying energy to said substrate, wherein said step of supplying energy to said material and said step of supplying energy to said substrate are controlled independently.

14. A method as claimed in claim 9, wherein said material is shaped to have an exposed major surface, and said providing said material is achieved such that said exposed major surface of said material faces a principal surface of said substrate on which said oxide film is carried.

15. A method as claimed in claim 9, wherein said method further comprises a step of incorporating an n-type dopant to said material.

16. A method as claimed in claim 15, wherein the n-type dopant is selected from the group consisting of As and P.

* * * * *